(12) United States Patent
Ohse et al.

(10) Patent No.: US 7,948,091 B2
(45) Date of Patent: May 24, 2011

(54) MOUNTING STRUCTURE FOR SEMICONDUCTOR ELEMENT

(75) Inventors: Yuko Ohse, Shinagawa (JP); Osamu Daikuhara, Shinagawa (JP); Hideki Takauchi, Kawasaki (JP)

(73) Assignees: Fujitsu Component Limited, Tokyo (JP); Fujitsu Limited, Kawasaki (JP)

( * ) Notice: Subject to any disclaimer, the term of this patent is extended or adjusted under 35 U.S.C. 154(b) by 594 days.

(21) Appl. No.: 11/797,883

(22) Filed: May 8, 2007

(65) Prior Publication Data

US 2008/0150163 A1     Jun. 26, 2008

(30) Foreign Application Priority Data

Dec. 22, 2006   (JP) ................................ 2006-345532

(51) Int. Cl.
*H01L 23/50*     (2006.01)
*H01L 23/12*     (2006.01)
*H01L 23/48*     (2006.01)
*H01L 23/495*    (2006.01)
*H01L 23/28*     (2006.01)

(52) U.S. Cl. ............. 257/783; 257/E23.01; 257/E23.04; 257/E23.145; 257/E31.117; 257/E23.043; 257/667; 257/796; 257/671; 257/672; 257/670; 257/730; 257/784; 257/786; 257/676

(58) Field of Classification Search .................. 257/783, 257/E23.01, E23.04, 774, 773, E23.145, 257/E31.117, E23.057, E2, 3.116, E23.043, 257/666, 676, 672, 670, 674, 730, 698, 671, 796, 667

See application file for complete search history.

(56) References Cited

U.S. PATENT DOCUMENTS 5,378,656 A  *  1/1995  Kajihara et al. ................ 29/827

(Continued)

FOREIGN PATENT DOCUMENTS

JP       63-153827    *  6/1988

(Continued)

OTHER PUBLICATIONS

Japanese Patent Office Action dated Jan. 4, 2011 in Application No. 2006-345532.

(Continued)

*Primary Examiner* — Alexander O Williams
(74) *Attorney, Agent, or Firm* — Staas & Halsey LLP

(57) ABSTRACT

A mounting structure for a semiconductor element is disclosed. The semiconductor element is bonded to a die pad through an adhesive film, which is formed by applying a predetermined amount of a paste adhesive onto the surface of the die pad and placing the semiconductor element on the die pad so as to press and spread the adhesive between the lower surface of the semiconductor element and the die pad. A wire extends between the semiconductor element and a terminal pad disposed around the die pad. The die pad includes plural grooves in the surface thereof. Each of the grooves extends from the center of the die pad toward a peripheral edge of the die pad and ends at the inner side of the peripheral edge of the die pad.

8 Claims, 16 Drawing Sheets

U.S. PATENT DOCUMENTS

| | | | | |
|---|---|---|---|---|
| 5,397,915 | A | * | 3/1995 | Nose .............................. 257/676 |
| 5,744,224 | A | * | 4/1998 | Takeuchi et al. .............. 428/209 |
| 5,874,773 | A | * | 2/1999 | Terada et al. ................. 257/676 |
| 6,516,994 | B2 | * | 2/2003 | Takahashi .................. 228/180.5 |
| 6,965,157 | B1 | * | 11/2005 | Perez et al. ................... 257/666 |
| 7,550,828 | B2 | * | 6/2009 | Ramakrishna et al. ....... 257/676 |
| 2001/0054640 | A1 | * | 12/2001 | Takahashi .................. 228/180.5 |
| 2002/0027270 | A1 | * | 3/2002 | Iwakiri ......................... 257/670 |
| 2002/0145180 | A1 | * | 10/2002 | Terui et al. .................... 257/666 |
| 2002/0195692 | A1 | * | 12/2002 | Yamada et al. ............... 257/669 |
| 2003/0006055 | A1 | * | 1/2003 | Chien-Hung et al. ....... 174/52.1 |
| 2004/0232528 | A1 | * | 11/2004 | Ito et al. ........................ 257/666 |
| 2008/0283978 | A1 | * | 11/2008 | Aripin et al. ................. 257/670 |

FOREIGN PATENT DOCUMENTS

| | | |
|---|---|---|
| JP | 01-297828 | 11/1989 |
| JP | 06-061276 | 3/1994 |
| JP | 09-199517 | 7/1997 |
| JP | 63-239967 | 10/1998 |

OTHER PUBLICATIONS

Patent Abstracts of Japan, Publication No. 06-061276, published Mar. 4, 1994.

Patent Abstracts of Japan, Publication No. 09-199517, published Jul. 31, 1997.

Patent Abstracts of Japan, Publication No. 63-239967, published Oct. 5, 1998.

* cited by examiner

CROSS SECTION IB-IB $W_1$ : 0.2~0.5mm

A : 0.5~0.8mm $L_1$ : 1.2mm

CROSS SECTION IIB-IIB        $V_1=V_0+V_{10}$

CROSS SECTION
IIIB-IIIB

CROSS SECTION VIB-VIB

CROSS SECTION VIB-VIB

W2 : 0.1~0.2mm
B : 0.3~0.5mm
L2 : 1.0mm

CROSS SECTION XIVB-XIVB

MOUNTING STRUCTURE FOR SEMICONDUCTOR ELEMENT

BACKGROUND OF THE INVENTION

1. Field of the Invention

The present invention generally relates to a mounting structure for a semiconductor element, and particularly relates to a mounting structure for a semiconductor element wherein a semiconductor bare chip is bonded through an adhesive film to a die pad on a board, and wherein a wire is bonded to and extends between a pad on the upper surface of the semiconductor bare chip and a pad near the die pad.

2. Description of the Related Art

Electronic devices for processing signals have electronic circuit modules therein. Some connectors for high-speed signal transmission also have electronic circuit modules therein. In such an electronic module, for example, a semiconductor bare chip is bonded to a die pad of a printed circuit board, and a wire is bonded to and extends between a pad on an upper surface of the semiconductor bare chip and a pad near the die pad.

Along with improvement in signal processing speed, the length of the wire extending between the pad on the upper surface of the semiconductor bare chip and the pad near the die pad has become recognized as a cause for lowering signal transmission accuracy.

A related-art semiconductor bare chip mounting structure 10 is shown in FIGS. 1A and 1B, in which a portion encapsulated by resin is not shown for clarity. In the semiconductor bare chip mounting structure 10, a semiconductor bare chip 20 is mounted on the upper surface of a printed circuit board 11 through application of Ag paste, and wires 30 extend between the semiconductor bare chip 20 and the vicinity thereof. The reference numeral 40 indicates a cured Ag paste film. The Ag paste is conductive adhesive, and is a mixture of a paste-type thermosetting adhesive with Ag particles.

FIG. 2A shows a part of the printed circuit board 11. A square-shaped die pad 13 and terminal pads 14 are formed on the upper surface of a board main body 12. The terminal pads 14 are arranged around the die pad 13. The area surrounded by a double-dot chain line is a semiconductor bare chip mount area 15 on which the semiconductor bare chip 20 is to be mounted. Each terminal pad 14 is spaced apart from the semiconductor bare chip mount area 15 by a distance A. The distance A is in a range from about 0.5 to 0.8 mm because a portion 40a of the Ag paste film 40 extending outside the semiconductor bare chip 20 might be relatively large.

The semiconductor bare chip 20 is a square-shaped piece of a wafer, and pads 21 are arranged along the outer circumference of the upper surface thereof.

The wires 30 are made of Au, each extending between the semiconductor bare chip 20 and the corresponding terminal pad 14 with one end bonded to one of the pads 21 and the other end bonded to the corresponding terminal pad 14.

Referring to FIGS. 2A and 2B, a predetermined amount of the Ag paste is applied onto the center of the die pad 13 by a potting machine (not shown) so as to form a generally ball-like Ag paste mass 41. Referring then to FIGS. 3A and 3B and FIGS. 4A and 4B, the semiconductor bare chip 20 is placed onto the Ag paste mass 41. The Ag paste mass 41 is pressed by the semiconductor bare chip 20, so that the Ag paste spreads on the upper surface of the die pad 13 as indicated by arrows 50 of FIG. 3A so as to be an Ag paste film 42 and then be an Ag paste film 43. The Ag paste film 43 is cured by heating, so that the semiconductor bare chip 20 is bonded onto the die pad 13 through the cured Ag paste film 40. The cured Ag paste film 40 extends across the entire lower surface and beyond the peripheral edge of the semiconductor bare chip 20.

<Patent Document 1> Japanese Patent Laid-Open Publication No. 1-297828

As the upper surface of the die pad is flat and smooth, the Ag paste applied on the upper surface of the die pad has high surface tension. Therefore, when pressed into a film, the Ag paste does not smoothly spread out and, in some directions, might not be large enough in amount.

In view of that, a volume V1 of the Ag paste mass 41 is greater than a logically required volume V0. Thus, the Ag paste film 43 is formed to extend beyond the peripheral edge of the semiconductor bare chip 20. The presence of this portion extending beyond the peripheral edge of the semiconductor bare chip 20 ensures bonding between the entire lower surface of the semiconductor bare chip 20 and the die pad 13.

The portion of the Ag paste film 43 extending beyond the peripheral edge of the semiconductor bare chip 20 is indicated by the reference numeral 40a in FIGS. 4A and 4B.

In the related art, as described above, when the Ag paste is pressed into a film, the Ag paste does not smoothly spread and, in some direction, might not be large enough in amount. Therefore, the volume V1 of the Ag paste of the Ag paste mass 41 is made greater than the logically required volume V0 by an additional volume V10 just to be safe. This makes a greatest width W1 of the portion 40a extending beyond the edges of the semiconductor bare chip 20 relatively large, which is in a range from about 0.2 to 0.5 mm.

If the surfaces of the terminal pads 14 are covered with the Ag paste, the wires 30 cannot be bonded to the terminal pads 14. To prevent this problem, the terminal pads 14 need to be formed at positions where the portion 40a does not reach. In FIG. 1B, the terminal pads 14 are spaced apart from the peripheral edge of the mounted semiconductor bare chip 20 by the distance A, which is in a range from about 0.5 to 0.8 mm. A length L1 of each wire 30 is about 1.2 mm. If, in the future, signal transmission becomes faster than now, reduction of signal transmission quality in the wires 30 might be a problem.

It is to be noted that a pressure membrane printing machine may be used in place of the potting machine. A pressure membrane printing machine is able to print an Ag paste film only on an area of the upper surface of the die pad 13 where the semiconductor bare chip 20 to be mounted. Therefore, when the semiconductor bare chip 20 is mounted, almost all of the Ag paste film is covered with the semiconductor bare chip 20. Accordingly, the terminal pads 14 may be located closer to the peripheral edge of the mounted semiconductor bare chip 20, which allows reduction of the length of the wires 30. However, the pressure membrane printing machine requires dedicated tools such as a printing screen, resulting in increase in the cost of the electronic circuit module. Moreover, if the semiconductor bare chip 20 is modified, a new printing screen needs to be prepared, which leads to a slow response to design change.

Using the potting machine for applying Ag paste is advantageous especially when the number of semiconductor bare chips to be mounted is small. In the case of electronic circuit modules embedded in connectors, because only a few semiconductor bare chips are mounted, the potting machine is used.

SUMMARY OF THE INVENTION

The present invention aims to provide a semiconductor element mounting structure that reduces the amount of Ag paste, which is applied by a potting machine, spreading beyond a peripheral edge of a mounted semiconductor bare chip compared with the related art.

In one embodiment of the present invention, there is provided a mounting structure for a semiconductor element, wherein the semiconductor element is bonded to a die pad through an adhesive film, the adhesive film being formed by applying a predetermined amount of a paste adhesive onto the surface of the die pad and placing the semiconductor element on the die pad so as to press and spread the adhesive between the lower surface of the semiconductor element and the die pad; a wire extends between the semiconductor element and a terminal pad disposed around the die pad; and the die pad includes plural grooves in the surface thereof, the grooves each extending from the center of the die pad toward a peripheral edge of the die pad and ending at the inner side of the peripheral edge of the die pad.

According to the above-described embodiment of the present invention, when the semiconductor element is placed to press the adhesive, the adhesive spreads smoothly by partly being guided by the grooves to the ends of the guides. Therefore, the adhesive spreads across the entire lower surface of the semiconductor element even if the amount of the adhesive applied to the die pad is reduced compared to the related art. As the amount of the adhesive applied to the die pad can be reduced, the amount of the adhesive spreading around the semiconductor element can also be reduced. Moreover, the adhesive spreads uniformly across the entire lower surface of the semiconductor element, thereby preventing the semiconductor element from being mounted in a tilted manner.

The reduction of the amount of the adhesive spreading around the semiconductor element allows disposing the terminal pads in positions closer to a semiconductor element mount area compared with the related art, and therefore allows reducing the wire length. That is, the above-described mounting structure of this invention is more suitable for high speed signal processing.

DETAILED DESCRIPTION OF THE EMBODIMENTS

The following describes preferred embodiments of the present invention.

Figure 1A:
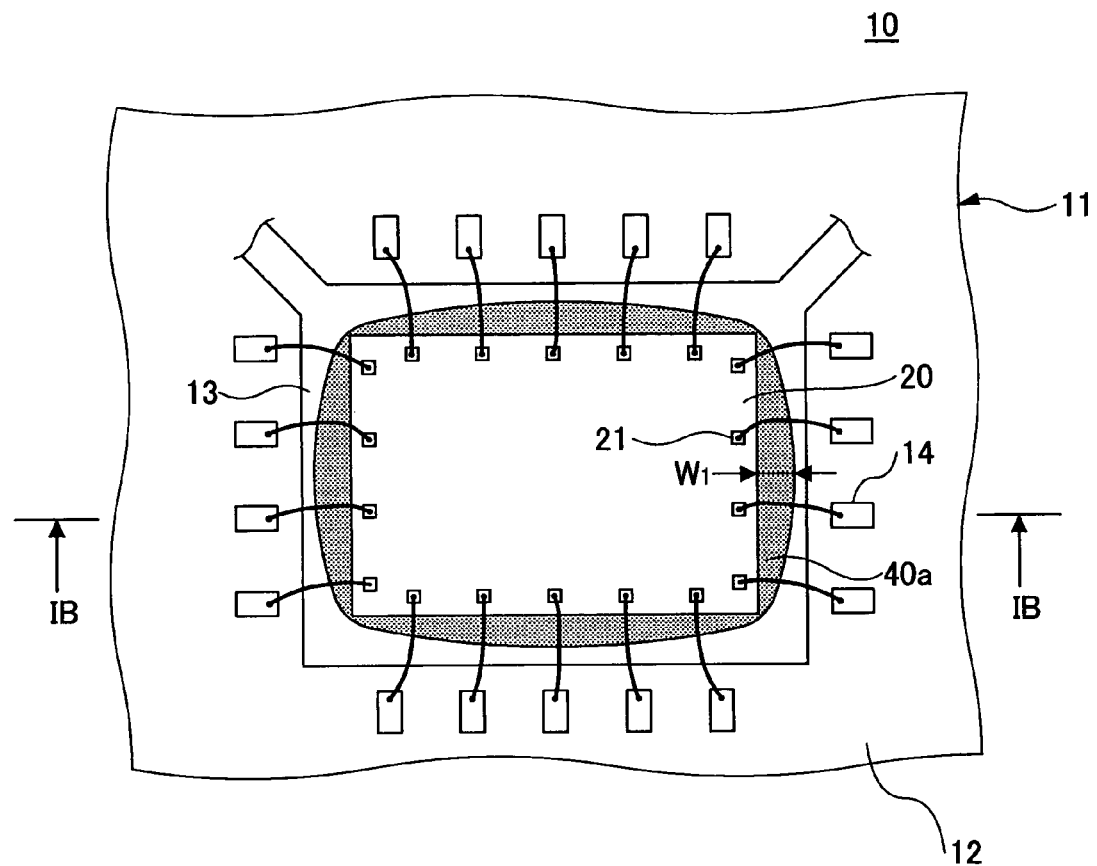
FIGS. 1A and 1B are illustrations showing a related-art semiconductor bare chip mounting structure.
Figure 1B:
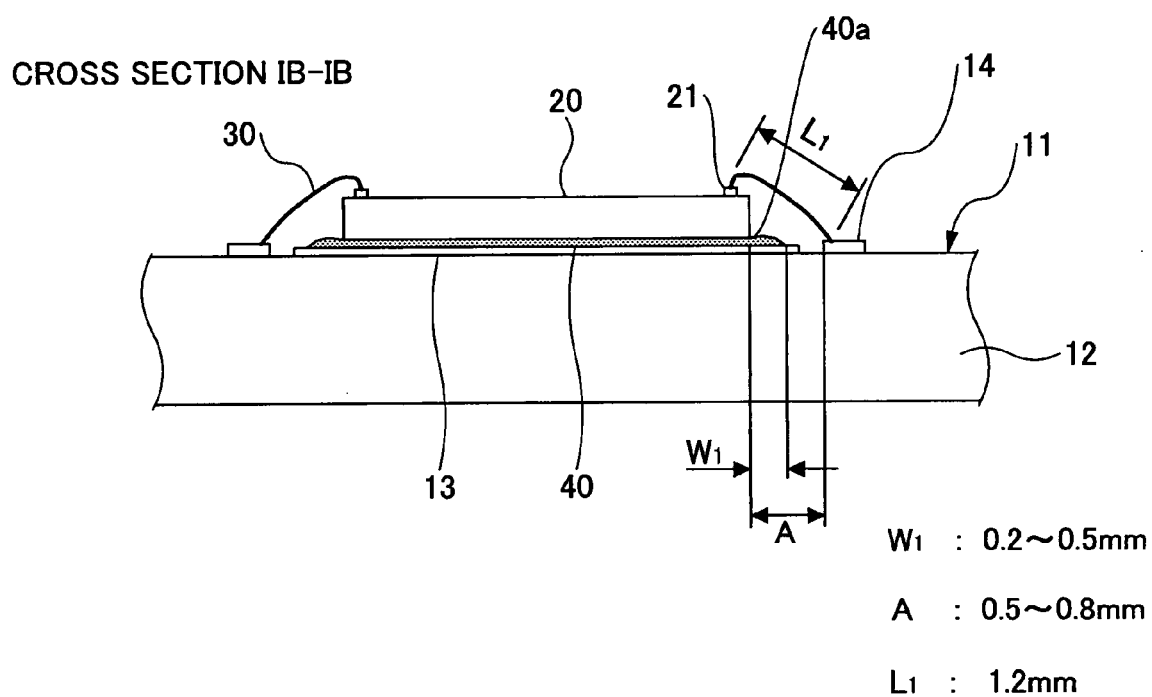
Figure 2A:
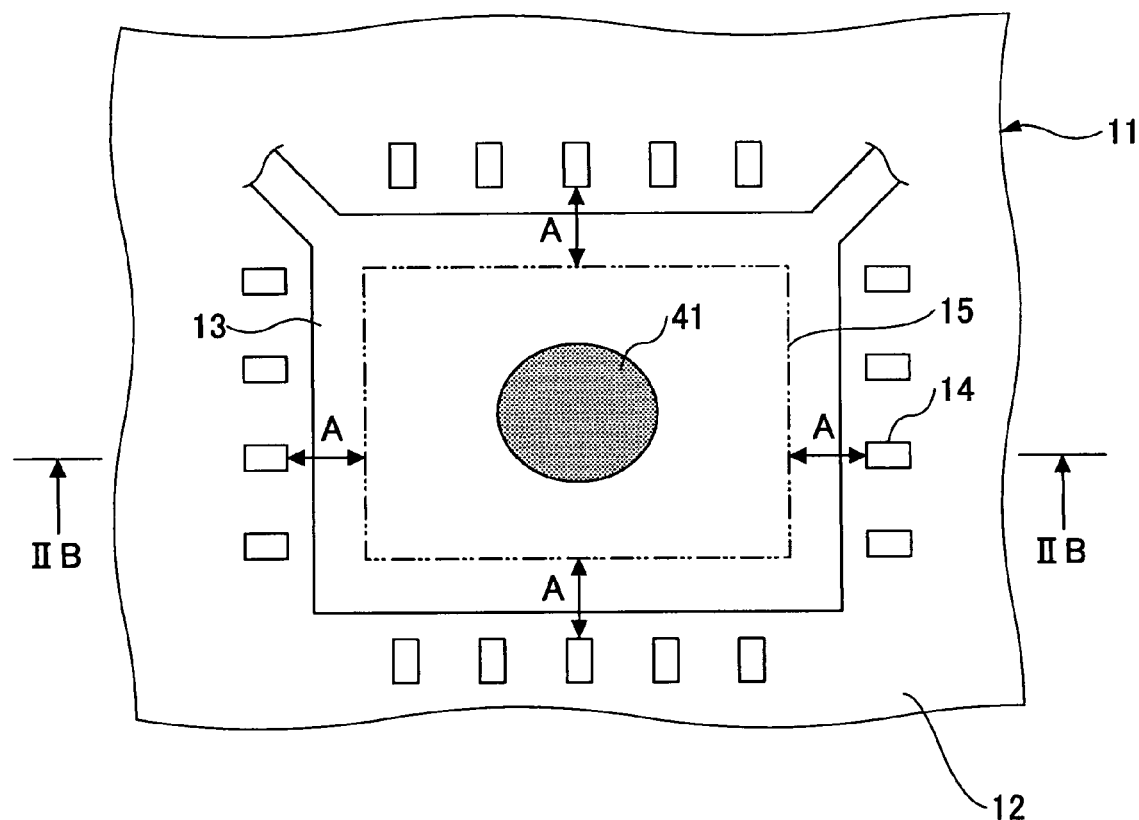
FIGS. 2A and 2B are illustrations each showing a printed circuited board of FIGS. 1A and 1B.
Figure 2B:
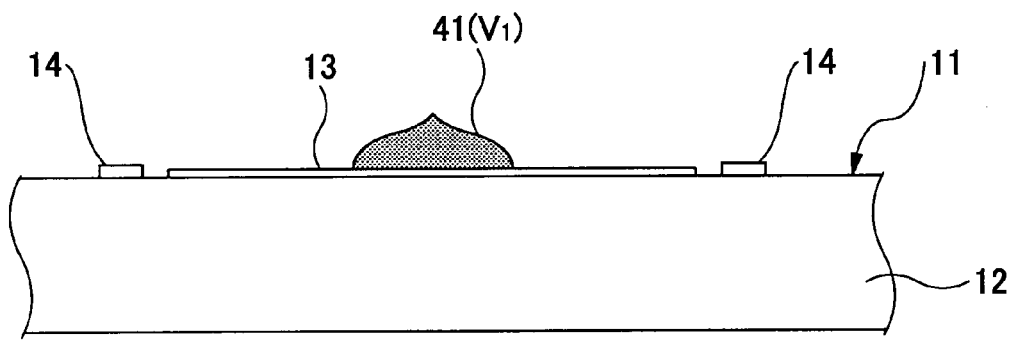
Figure 3A:
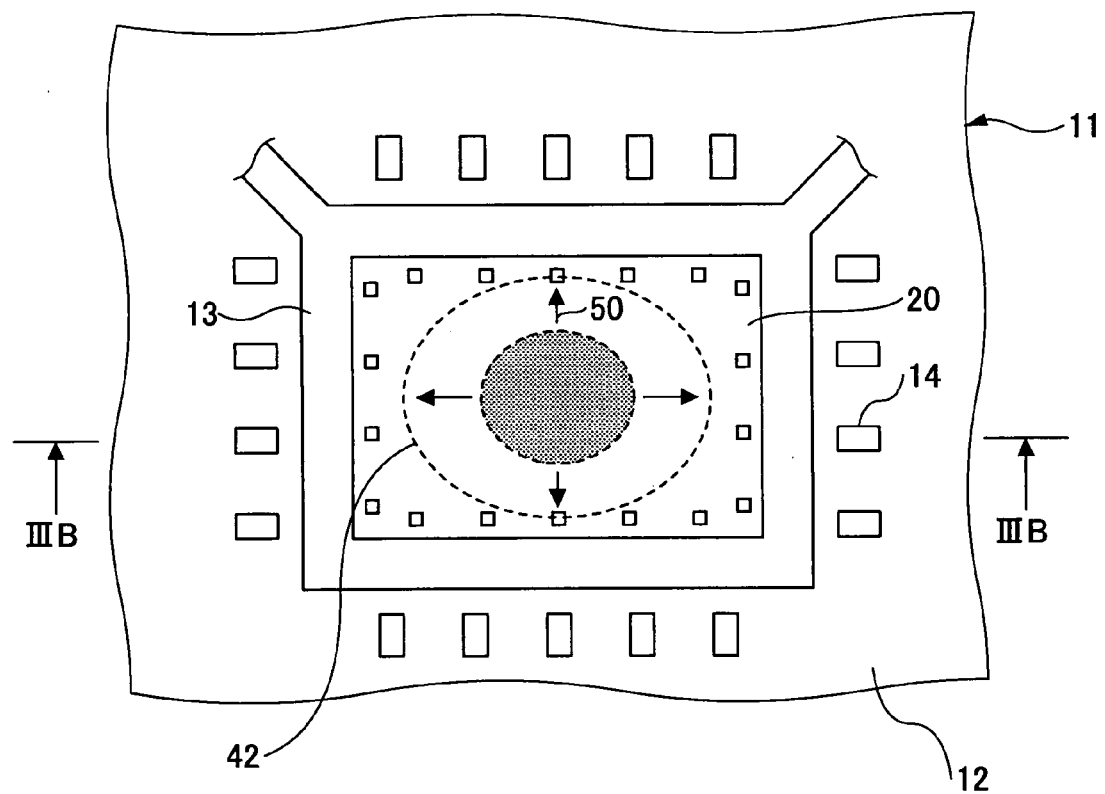
FIGS. 3A and 3B are views illustrating the spreading of Ag paste by placing a semiconductor bare chip.
Figure 3B:
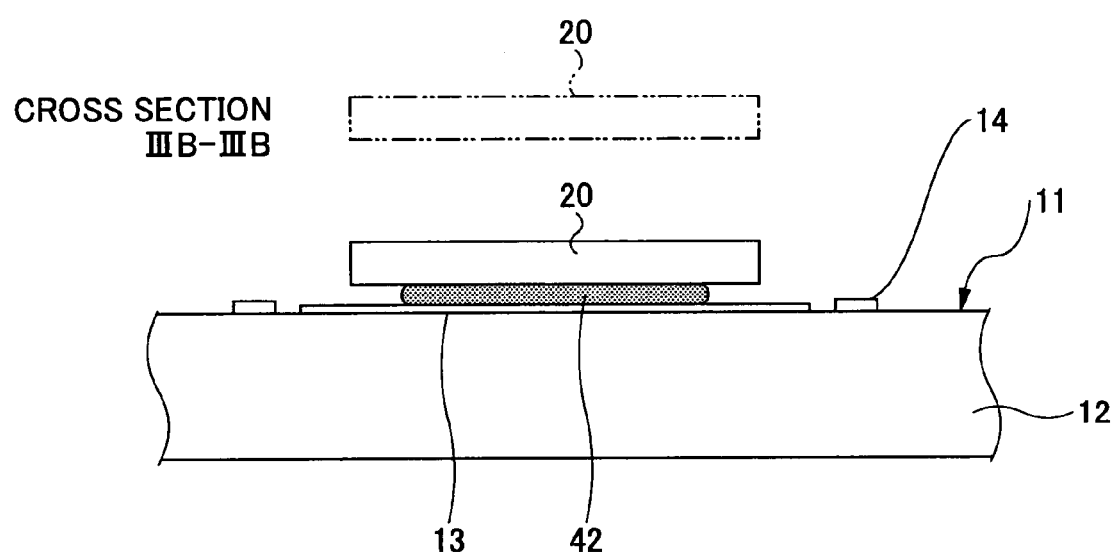
Figure 4A:
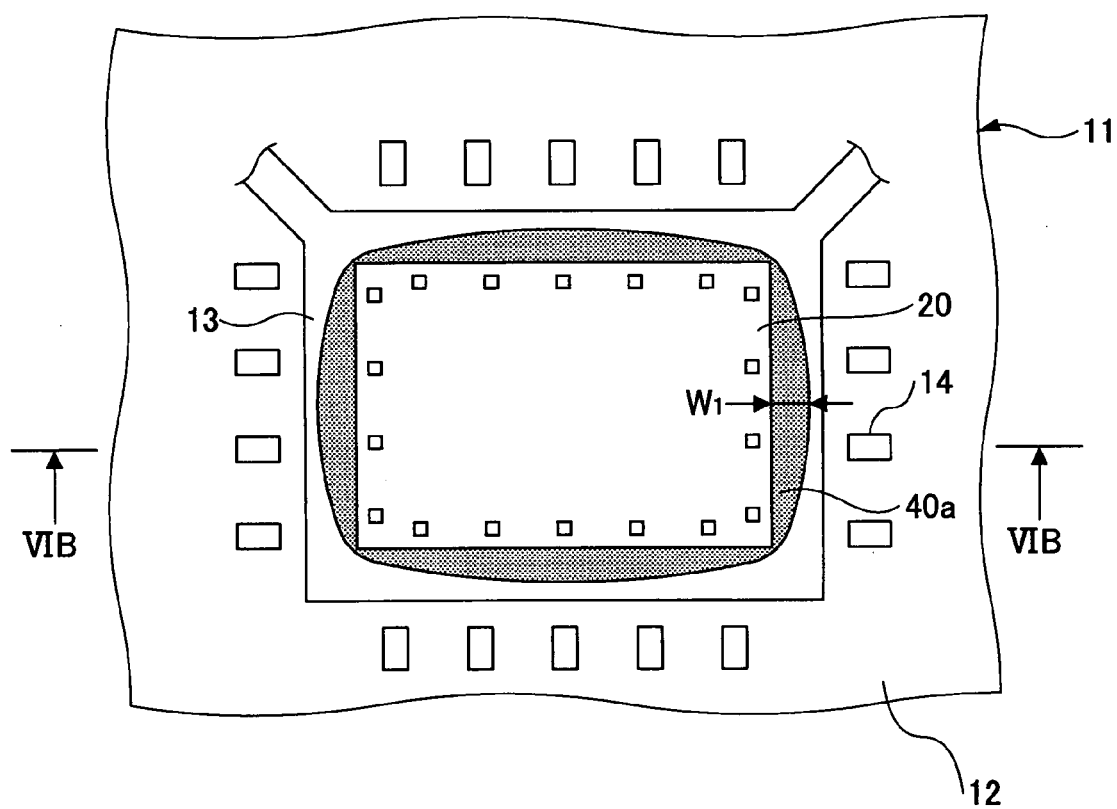
FIGS. 4A and 4B are illustrations each showing Ag paste formed into a film by placing a semiconductor bare chip.
Figure 4B:
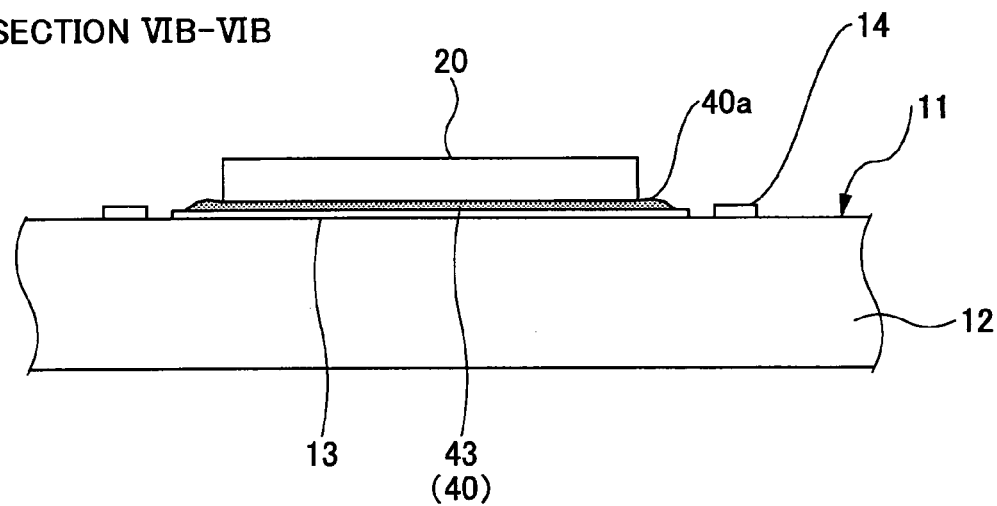
Figure 5:
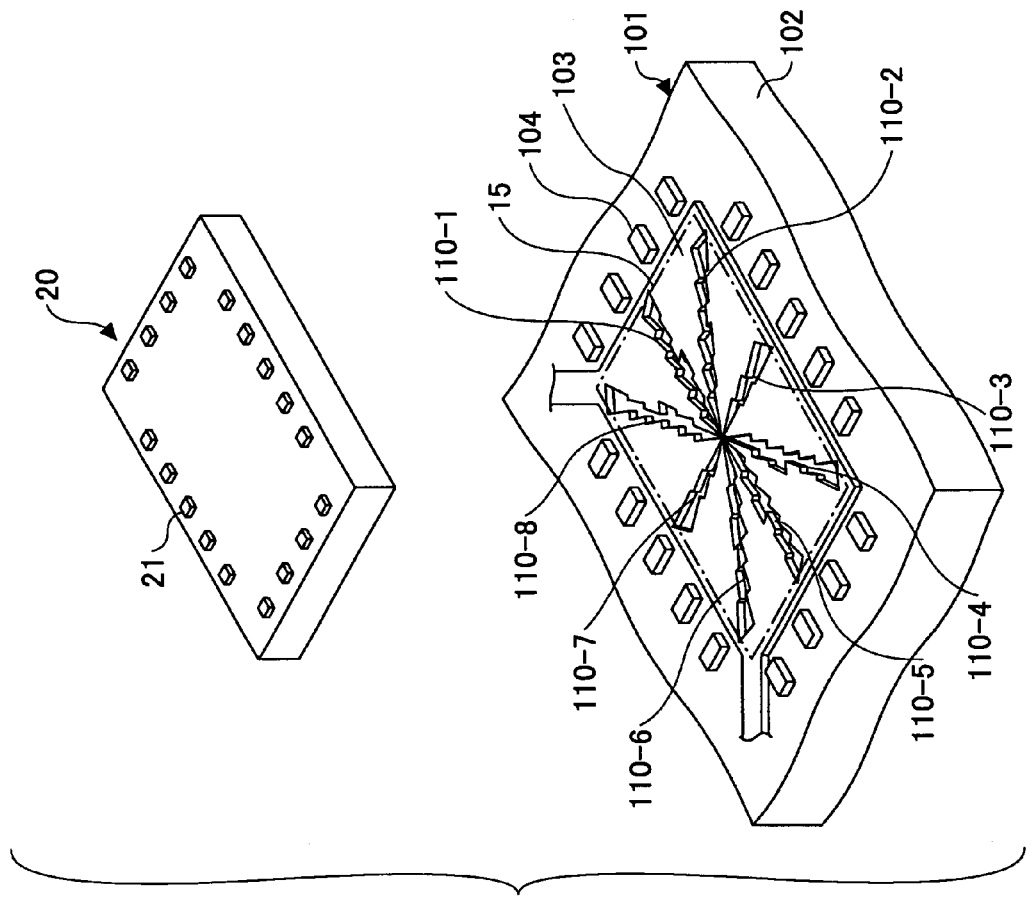
FIG. 5 is a perspective view showing a semiconductor bare chip mounting structure according to a first embodiment of the present invention.
Figure 5:
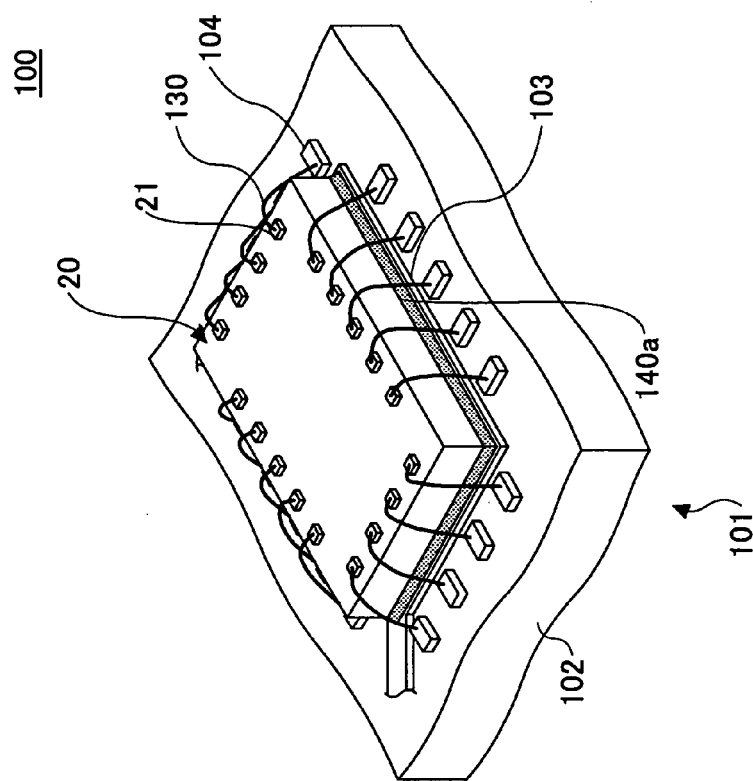
Figure 6A:
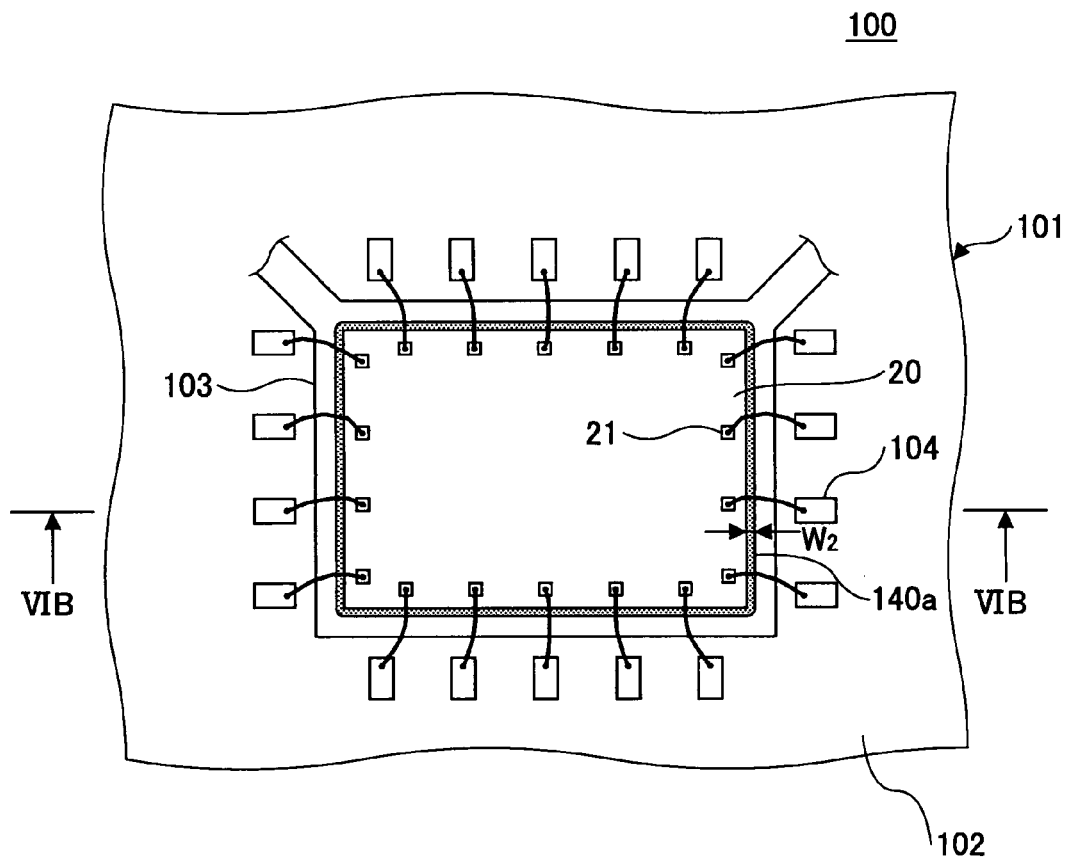
FIG. 6A is a plan view showing the semiconductor bare chip mounting structure of FIG. 5.
Figure 6B:
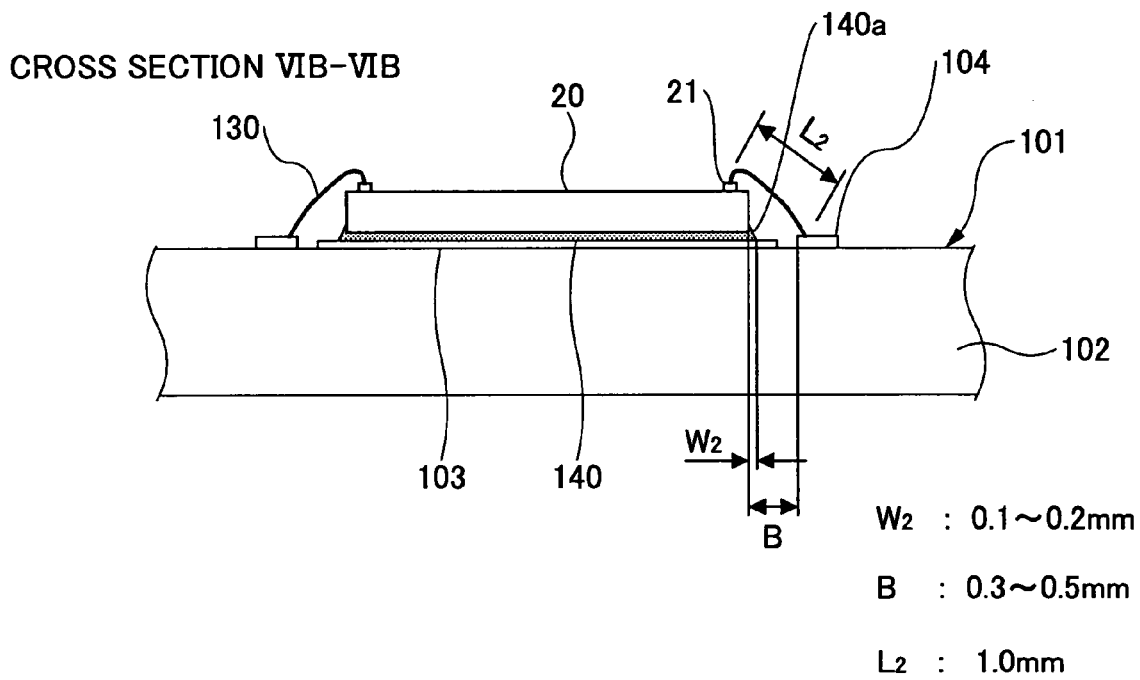
FIG. 6B is a cross-sectional view taken along the line VIB-VIB of FIG. 6A.

FIG. 5, FIG. 6A, and FIG. 6B are illustrations each showing a semiconductor bare chip mounting structure 100 according to a first embodiment of the present invention, in which a portion encapsulated by resin is not shown for clarity. In the semiconductor bare chip mounting structure 100, a semiconductor bare chip 20, which is identical to the semiconductor bare chip 20 of FIGS. 1A and 1B, is mounted on the upper surface of a printed circuit board 101 through application of Ag paste. Wires 130 extend between the semiconductor bare chip 20 and the vicinity thereof. It is to be noted that the arrows X1-X2 (FIG. 7) indicate the longitudinal direction of the semiconductor bare chip 20 and a die pad 103 (described below), and the arrows Y1-Y2 (FIG. 7) indicate the direction orthogonal to the direction of X1-X2. The semiconductor bare chip 20 is an example of a semiconductor element, and the Ag paste is an example of adhesive.

Figure 7:
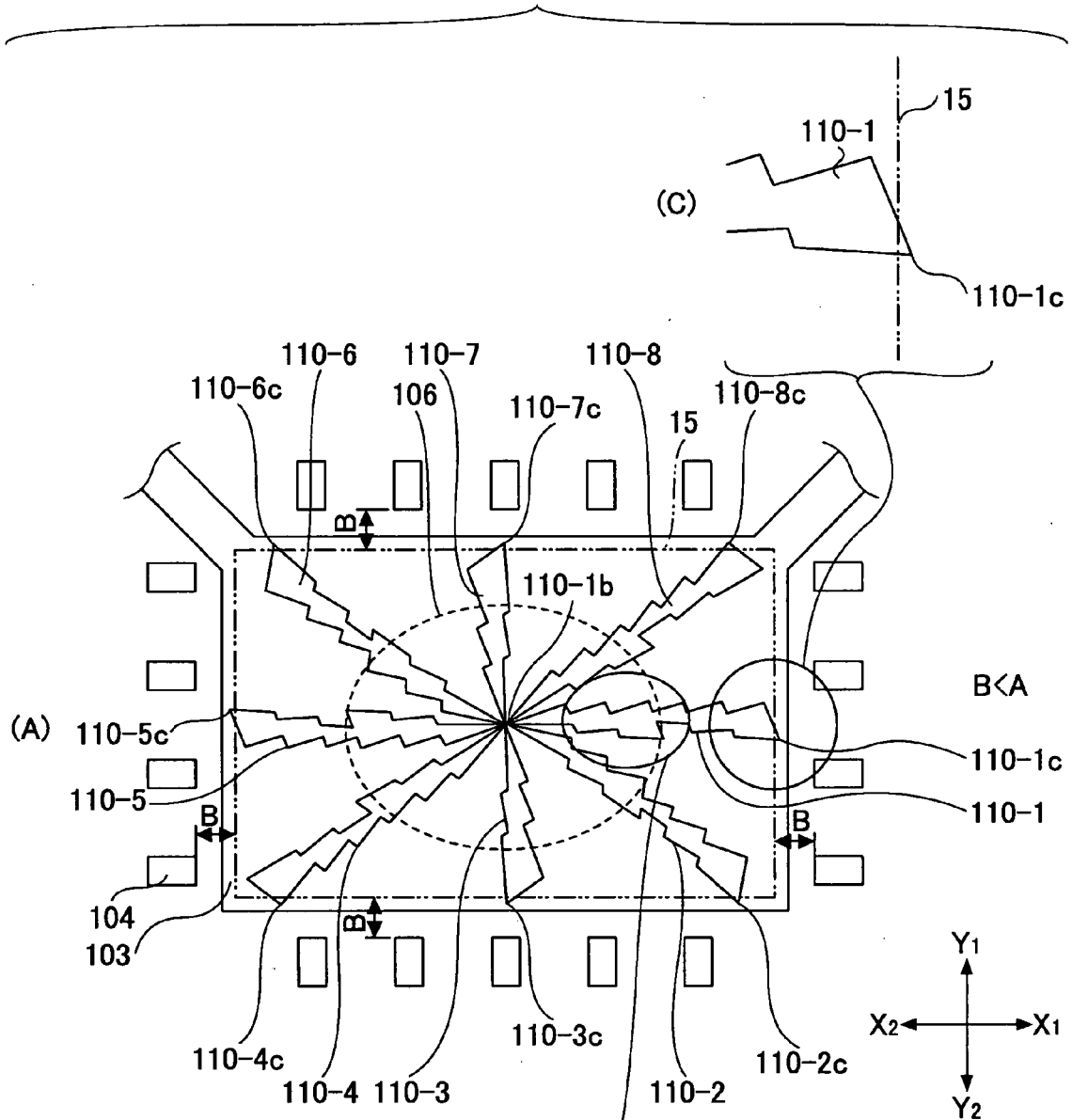
FIG. 7 is an enlarged view showing a die pad of FIG. 5.
Figure 7:
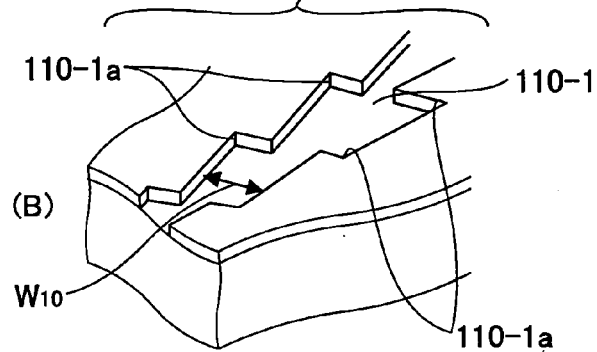

A part of the printed circuit board 101 is shown in (A) of FIG. 7. The die pad 103 having a square shape and terminal pads 104 are formed on the upper surface of an epoxy-made board main body 102 of the printed circuit board 101. The terminal pads 104 are arranged around the die pad 103. The reference numeral 15 indicates a semiconductor bare chip mount area, and the reference numeral 106 indicates an Ag paste mass area where an Ag paste mass is to be formed.

The die pad 103 has grooves 110-1 through 110-8 extending radially in eight directions from the center of the die pad 103. The eight directions are the longitudinal direction, the width direction, and the diagonal directions of the die pad 103. The grooves 110-1 through 110-8 do not reach the peripheral edge of the die pad 103. In other words, the grooves 110-1 through 110-8 do not extend beyond the peripheral edge of the die pad 103. The grooves 110-1 through 110-8 are formed in the semiconductor bare chip mount area 15. Referring also to (B) of FIG. 7, each of the grooves 110-1 through 110-8 has a shape substantially of connected triangles each pointing to the center of the die pad 103, i.e., each having an apex at the center side of the die pad 103 and a base at the outer side of the die pad 103. Each of the grooves 110-1 through 110-8 has, thereinside, angular depressions 110-1a at the opposing sides thereof. The grooves 110-1 through 110-8 have a common beginning 110-1b inside the Ag paste mass area 106 and respective sharply-pointed terminal ends 110-1c through 110-8c slightly outside the semiconductor bare chip mount area 15. As described below, when the Ag paste mass is pressed by the semiconductor bare chip 20 to spread radially, the grooves 110-1 through 110-8 help the Ag paste mass to spread by guiding the Ag paste outward as if blood capillaries, and finally serve to reduce the width of a portion 140a of an Ag paste film 140 extending outside the semiconductor bare chip 20. The angular depressions 110-1a draw the Ag paste thereinto as if blood capillaries. An average width W10 of the grooves 110-1 through 110-8 is in a range from about 0.05 to 0.1 mm. The method of forming the grooves 110-1 through 110-8 is described below.

The size of the die pad 103 is reduced compared to the die pad 13 of FIG. 1 due to the presence of the grooves 110-1 through 110-8, i.e., due to the reduced width of the portion 140a of the cured Ag paste film 140 extending outside the semiconductor bare chip 20.

As the size of the die pad 103 is reduced, the terminal pads 104 are located closer to the semiconductor bare chip mount area 15. A distance B between each terminal pad 104 and the semiconductor bare chip mount area 15 is less than the distance A (i.e. B<A).

Referring back to FIG. 5, FIG. 6A, and FIG. 6B, the cured Ag paste film 140 extends across the entire lower surface of the semiconductor bare chip 20. The semiconductor bare chip 20 is bonded to and electrically connected to the die pad 103 through the cured Ag paste film 140. The reference numeral 140a indicates the portion of the cured Ag paste film 140 extending beyond the peripheral edge of the semiconductor bare chip 20. A greatest width W2 of the portion 140a is about 0.1 mm, which is smaller than the greatest width W1 of the related art.

Each wire 130 of Au extends between the semiconductor bare chip 20 and the corresponding terminal pad 104 with one end bonded to a pad 21 and the other end bonded to the corresponding terminal pad 104. A length L2 of each wire 130 is about 1.0 mm, which is about 0.2 mm less than the length L1. The reduced length of 0.2 mm is as large as 20% of the length L2 of the wire 130, which prevents lowering of signal transmission quality in the wires 30 if, in the future, signal transmission becomes faster than now.

Moreover, the Ag paste film 140 extends across the entire lower surface of the semiconductor bare chip 20, which prevents the mounted semiconductor bare chip 20 from being tilted.

The following describes the reasons why the portion 140a can be reduced.

The first reason is that there are formed the grooves 110-1 through 110-8 for facilitating the spreading of the Ag paste. The second reason is that, since the Ag paste smoothly spreads to the peripheral edge of the semiconductor bare chip mount area 15 due to the grooves 110-1 through 110-8, an additional volume V11 of the Ag paste added to the logically required volume V0 is less than the additional volume V10 of the related art.

The following describes how the Ag paste spreads with reference to FIGS. 8A through 8D and FIGS. 9A through 9F.

Figure 8A:
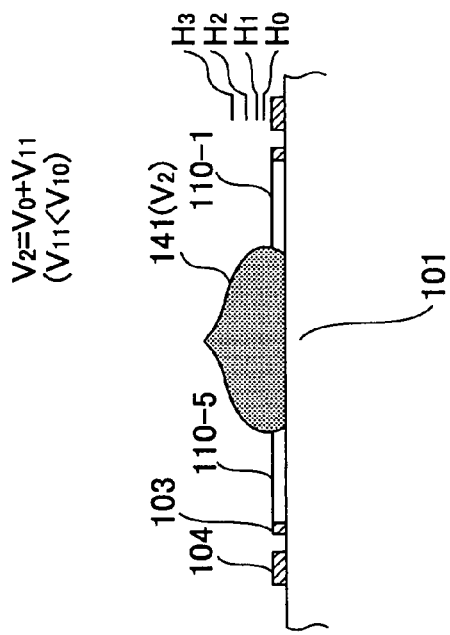
FIGS. 8A-8D and FIGS. 9A-9F are views illustrating spread of Ag paste by placing a semiconductor bare chip.
Figure 8B:
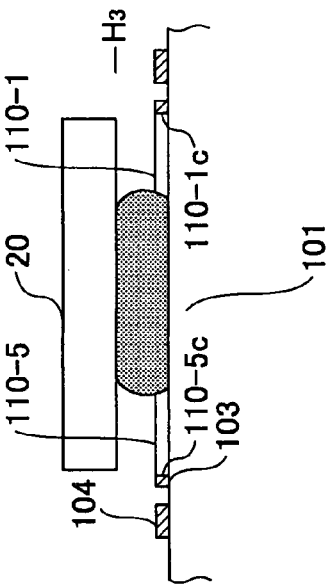

FIGS. 8A and 8B show the printed circuit board 101 horizontally fixed, on which a ball-like Ag paste mass 141 is formed by applying a predetermined amount of Ag paste onto the center of the die pad 103 with use of a potting machine (not shown). The viscosity of the Ag paste is about 36,000 mPa·s, which is about the same as the viscosity of toothpaste.

A volume V2 of the Ag paste of the Ag paste mass 141 is the sum of the logically required volume V0 and the additional volume V11. The additional volume V11 is less than the additional volume V10 of the related art because the Ag paste film 140 is more smoothly formed across the entire lower surface of the semiconductor bare chip 20 compared with the related art.

The semiconductor bare chip 20 supported by a die-bonding machine (not shown) is lowered to a final height H0 (FIGS. 9E and 9F) while maintaining a horizontal attitude.

Figure 8C:
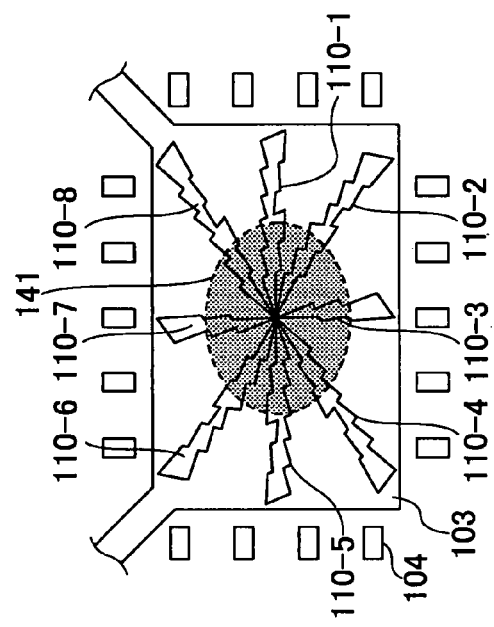
Figure 8D:
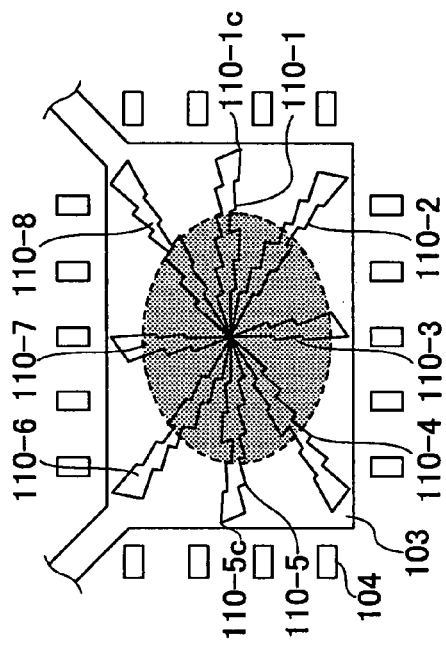

FIGS. 8C and 8D show the semiconductor bare chip 20 lowered to a height H3 to be in contact at the lower surface thereof with the Ag paste mass 141 and start pressing the Ag paste mass 141. In the course of lowering the semiconductor bare chip 20 to the final height H0, the Ag paste mass 141 is pressed by the semiconductor bare chip 20 to spread between the upper surface of the die pad 103 and the lower surface of the semiconductor bare chip 20, and thus formed into a film.

Figure 9A:
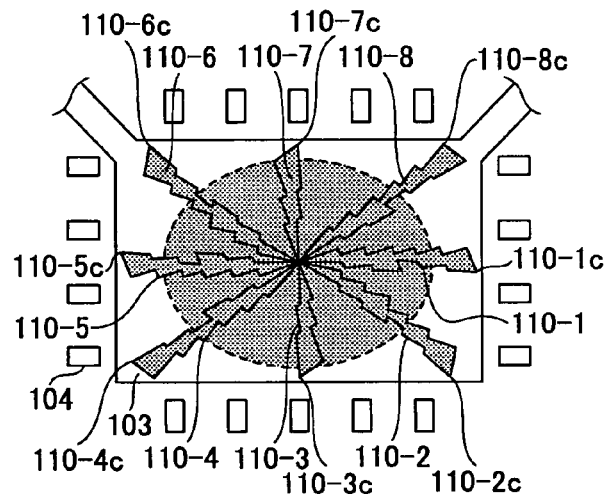
Figure 9B:
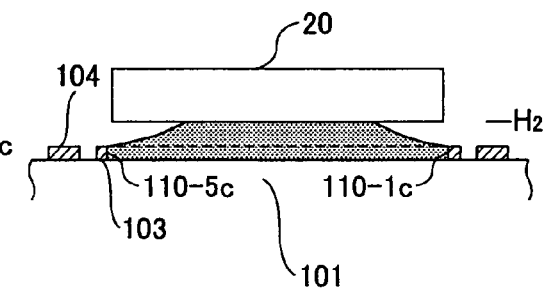

FIGS. 9A and 9B show the semiconductor bare chip 20 lowered to a height H2. The Ag paste spreads more easily in the grooves 110-1 through 110-8 than on the surface of the die pad 103. On the surface of the die pad 103, the Ag paste spreads outward by being pressed by the semiconductor bare chip 20. Meanwhile, in the grooves 110-1 through 110-8, the Ag paste spreads faster than on the surface of the die pad 103 to reach the terminal ends 110-1c through 110-8c of the grooves 110-1 through 110-8.

Figure 9C:
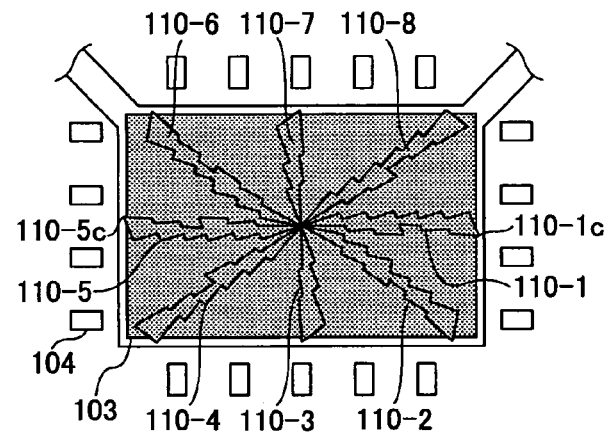
Figure 9D:
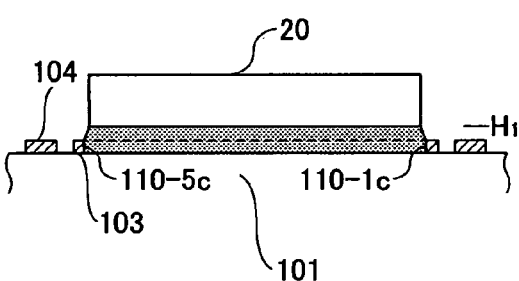
Figure 9E:
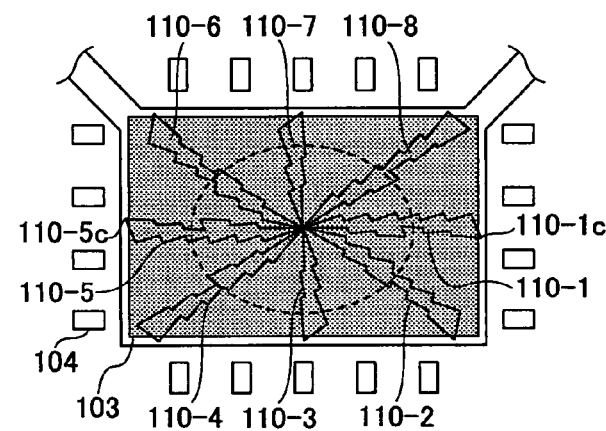
Figure 9F:
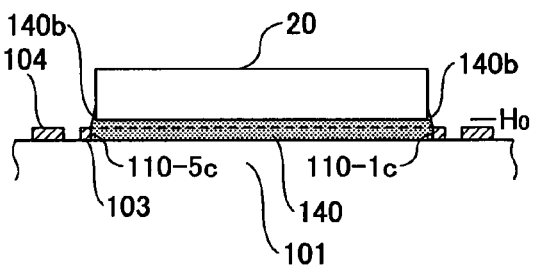

In the course of lowering the semiconductor bare chip 20 through the height H1 of FIGS. 9C and 9D to the final height H0 of FIGS. 9E and 9F, the Ag paste on the surface of the die pad 103 spreads outward to be formed into a film, while the Ag paste in the grooves 110-1 through 110-8 runs out of the terminal ends 110-1c through 110-8c to fill the gap under the lower surface of the semiconductor bare chip 20 near the peripheral edge thereof. Also, the Ag paste comes into contact with the circumferential surface of the semiconductor bare chip 20 to form a filler 140b. The Ag paste that has run out of the terminal ends 110-1c through 110-8c of the grooves 110-1 through 110-8 mainly forms the filler 140b.

The filler 140b corresponds to the portion 140a of the Ag paste film 140 extending outside the semiconductor bare chip 20. The greatest width W2 is about 0.1 mm, which is smaller than the greatest width W1 of the related art.

As described above, the Ag paste film 140 is formed by the Ag paste spreading outward from the center of the die pad 103 and also from the vicinity of the peripheral edge of the die pad 103, so that the Ag paste film 140 extending across the entire lower surface of the semiconductor bare chip 20 is formed more smoothly than that in the related art.

As for the volume V2 of the Ag paste of the Ag paste mass 141, as mentioned above, since the Ag paste film 140 extending across the entire lower surface of the semiconductor bare chip 20 is smoothly formed, the additional volume V11 added to the logically required volume V0 is less than the additional volume V10 of the related art. The portion 140a of the Ag paste film 140 extending beyond the peripheral edge of the semiconductor bare chip 20 is the filler 140b, and the greatest width W2 of the portion 140a is less than the greatest width W1 of the related art.

Instead of the terminal ends 110-1c through 110-8c of the grooves 110-1 through 110-8 extending outside the semiconductor bare chip mount area 15, and may be inside, but near the peripheral edge of the semiconductor bare chip mount area 15.

The radially extending grooves 110-1 through 110-8 may have zigzag shapes.

The Ag paste may be replaced with other adhesives.

Figure 10:
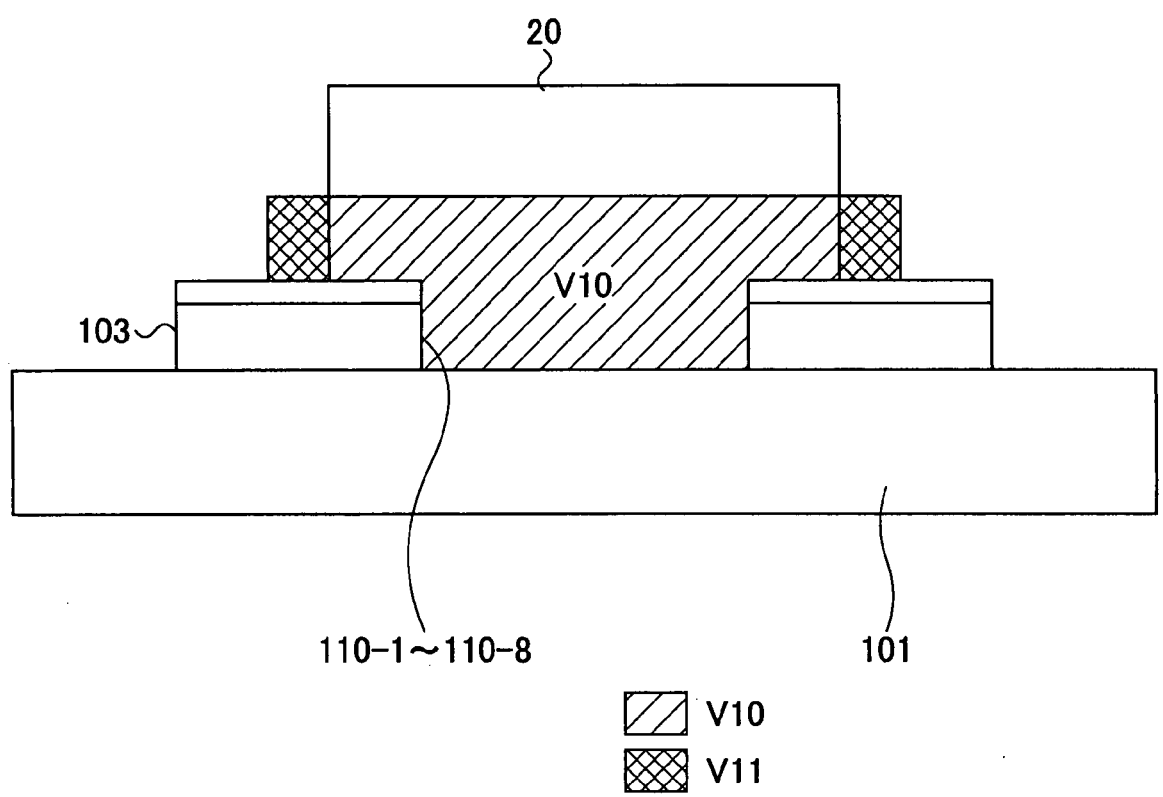
FIG. 10 is a view illustrating the amount of the Ag paste.

FIG. 10 shows a relationship between the logically required volume V0 of the Ag paste and the additional volume V11. The cross section with single-hatched lines defines the logically required volume V10, and the cross section with cross-hatched lines defines the additional volume V11.

Figure 11A:
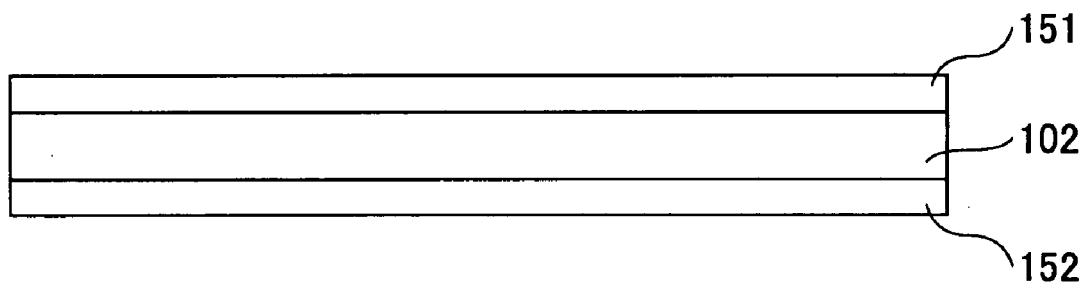
FIGS. 11A-11C are views illustrating a process of forming grooves in the die pad of FIG. 5.
Figure 11B:
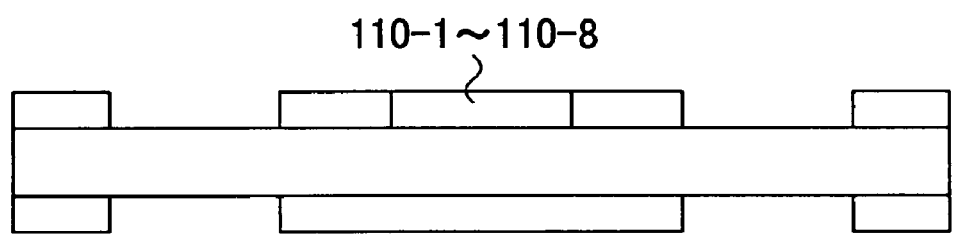
Figure 11C:
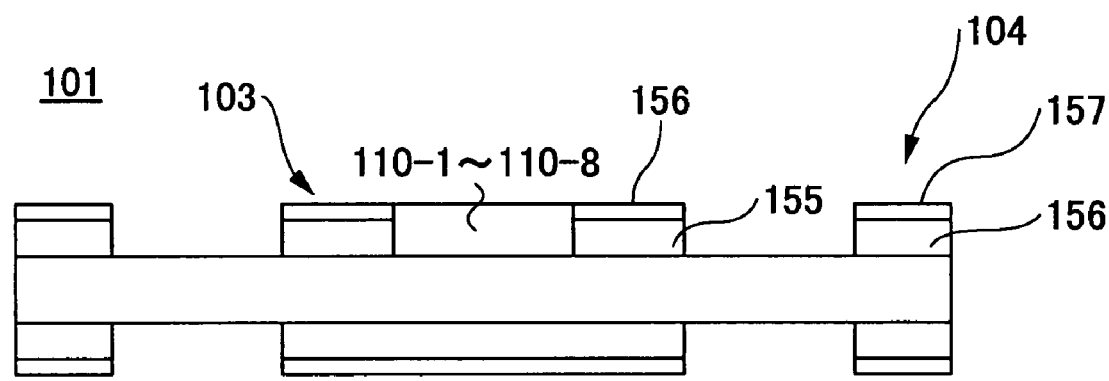

FIGS. 11A through 11C illustrate a production process of the printed circuit board 101, especially a process of forming the grooves 110-1 through 110-8.

FIG. 11A shows a material 150 of the printed circuit board 101. The material 150 includes the board main body 102 made of FR-4 epoxy resin, and CU films 151 and 152 covering the entire upper surface and the entire lower surface, respectively, of the board main body 102.

A resist film is formed on the surface of the material 150. In the next step, the resist film is covered with a mask (not shown) and goes through an exposure process. After removing the mask, development and etching are performed. Then, the remaining resist film is removed. FIG. 11B shows the material 150 after completion of these steps. The mask has a pattern corresponding to the grooves 110-1 through 110-8 in addition to patterns corresponding to the die pad 103 and the terminal pads 104.

Accordingly, in the step of forming a die pad main body 155 and terminal pad main bodies 156, the grooves 110-1 through 110-8 are also formed.

Au plating is applied in the final step, and thus the printed circuit board 101 shown in FIG. 11C is fabricated. The reference numeral 157 indicates an Au plating film.

The following describes a modified example of the above-described die pad 103.

Figure 12:
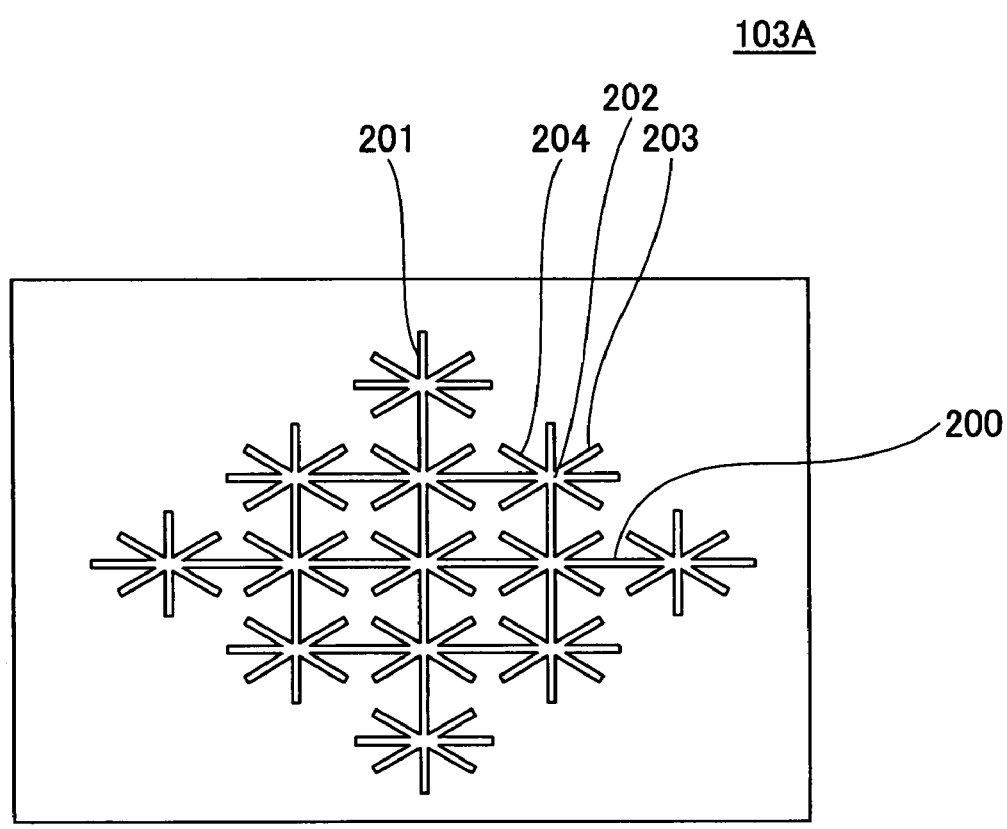
FIG. 12 is a view showing a die pad as a first modified example.
Figure 12:
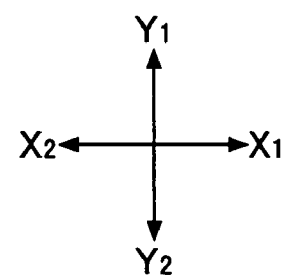

FIG. 12 shows a die pad 103A as a first modified example.

The die pad 103A has plural grooves 200 extending in the X direction and plural grooves 201 extending in the Y direction that cross each other to be arranged in a lattice manner. The die pad 103A also has plural pairs of short diagonal grooves 203 and 204 that cross each other. Each pair of the diagonal grooves 203 and 204 passes a corresponding intersection 202 of the groove 200 with the groove 201.

The grooves 200 guide the Ag paste in the X direction, while the grooves 201 guide the Ag paste in the Y direction. That is, the grooves 200 and 201 guide the Ag paste toward the peripheral edge of the die pad 103A. The grooves 203 and 204 guide the Ag paste to the vicinity of the intersections 202.

Figure 13:
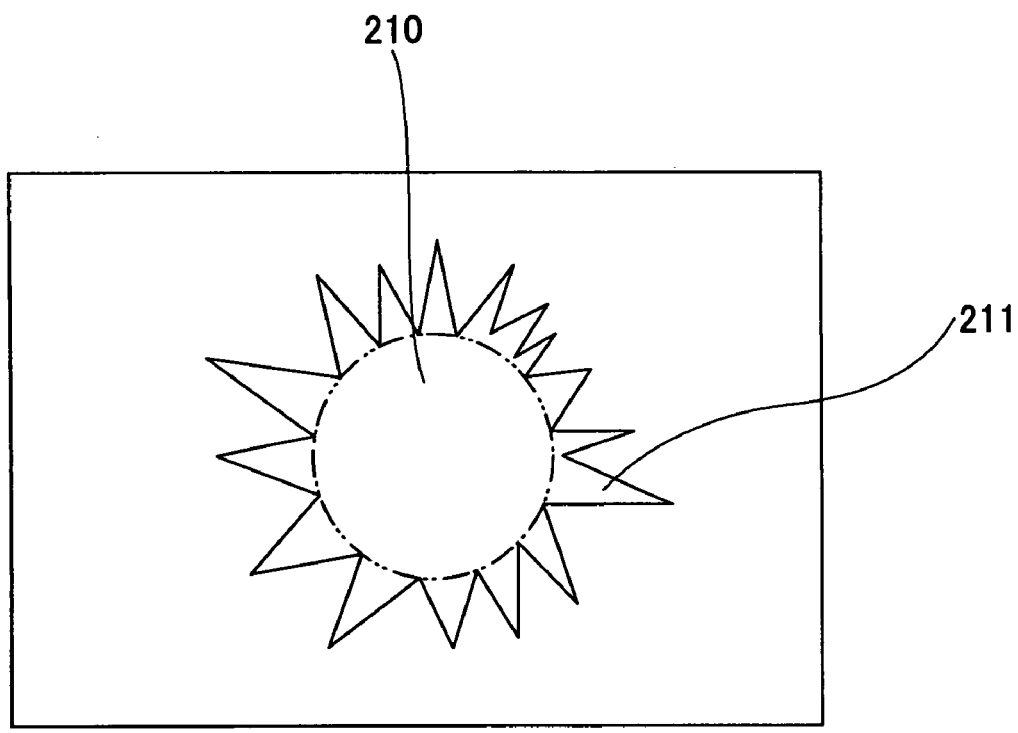
FIG. 13 is a view showing a die pad as a second modified example.
Figure 13:
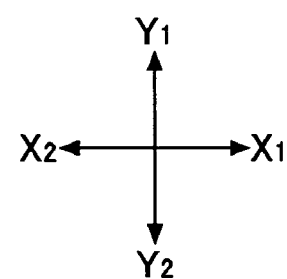

FIG. 13 shows a die pad 103B as a second modified example.

The die pad 103B has a substantially circular recess 210 and plural triangular grooves 211 arranged along the entire circumference of the recess 210 and extending radially.

The grooves 211 guide the Ag paste outward.

Figure 14:
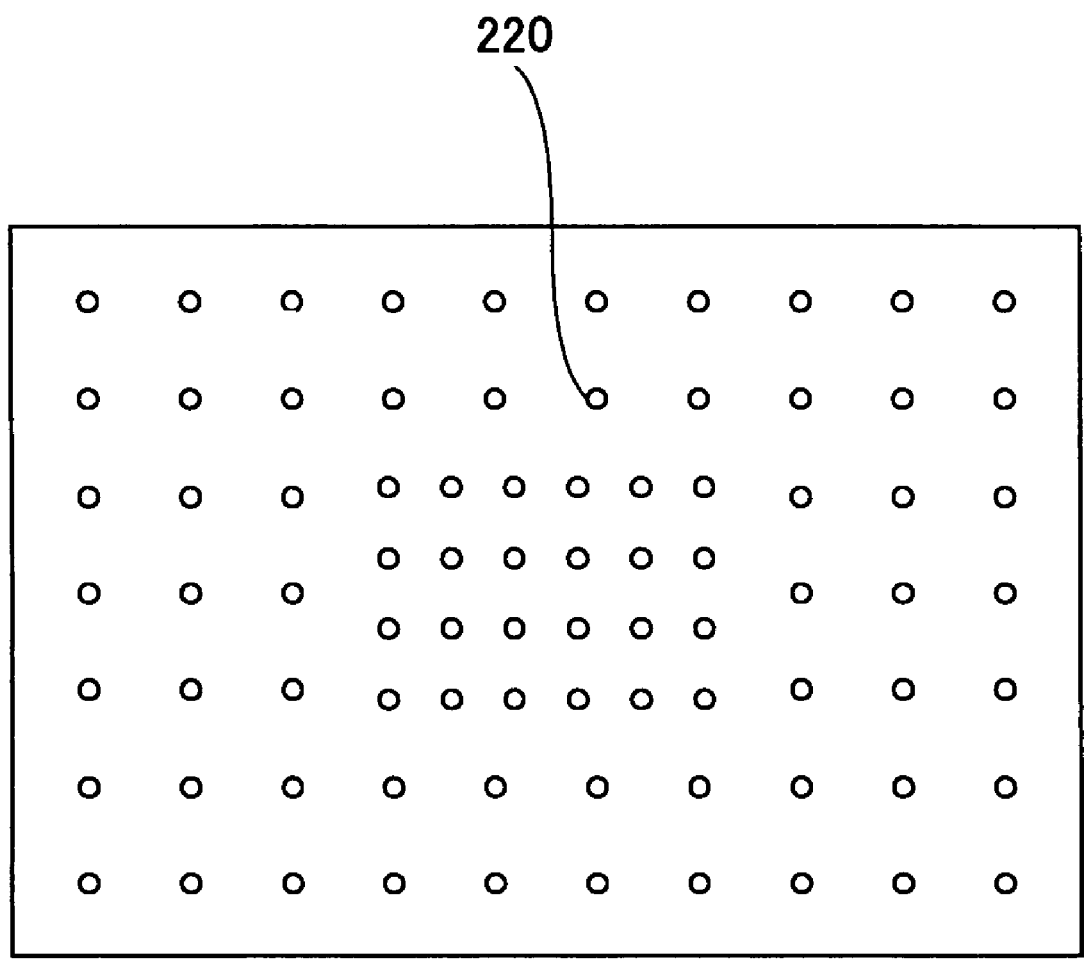
FIG. 14 is a view showing a die pad as a third modified example.

FIG. 14 shows a die pad 103C as a third modified example.

The die pad 103C has small recesses 220 arranged with a variation of density. The density of the small recesses 220 increases toward the center and decreases toward the outer side.

The surface tension of the Ag paste on the die pad 103C is low in a region where the small recesses 220 are densely arranged, and increases as the density of the small recesses 220 decreases.

With this configuration, when the Ag paste mass 141 is pressed in the process of mounting the semiconductor bare chip 20, the spreading speed of the Ag paste lowers as the Ag paste spreads outward. This decreases the amount of the Ag paste running beyond the peripheral edge of the semiconductor bare chip 20.

The small recesses 220 may be replaced with small projections.

The recesses 220 or the projections are formed by etching in the step of forming the outline of the die pad 103B as in the case of the grooves 110-1 through 110-8.

Figure 15A:
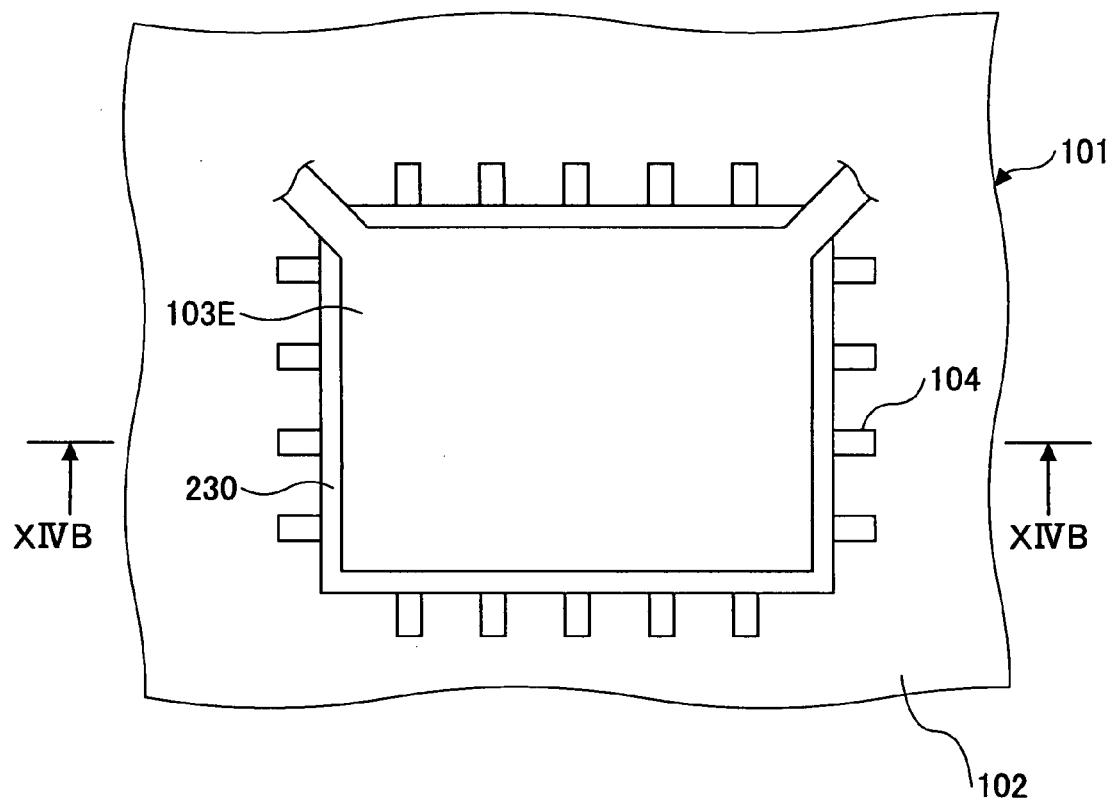
FIG. 15 is a view showing a die pad as a fourth modified example.
Figure 15B:
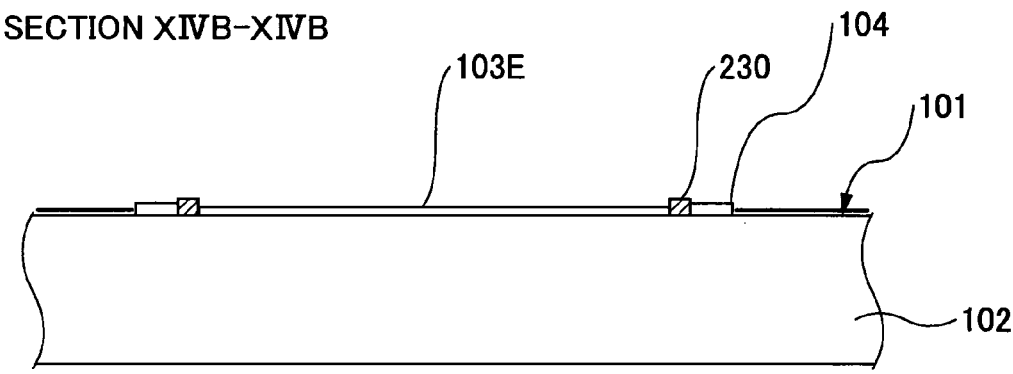

FIGS. 15A and 15B show a die pad 103E as a fourth modified example.

The die pad 103E is the same as the related-art die pad 13, but a rectangular dam 230 of solder resist is formed by increasing the thickness of a solder resist film in a region between the circumference of the die pad 103E and the terminal pads 104. The solder resist film is applied on the surface of the printed circuit board 101 except the area of the die pad 103E and the terminal pads 104. That is, the dam 230 is formed without using additional members.

The terminal pads 104 are arranged along the outside of the dam 230.

The dam 230 prevents the Ag paste from going beyond the peripheral edge of the semiconductor bare chip 20.

The die pad 103E may have the grooves 110-1 through 110-8 shown in FIG. 7.

Figure 16A:
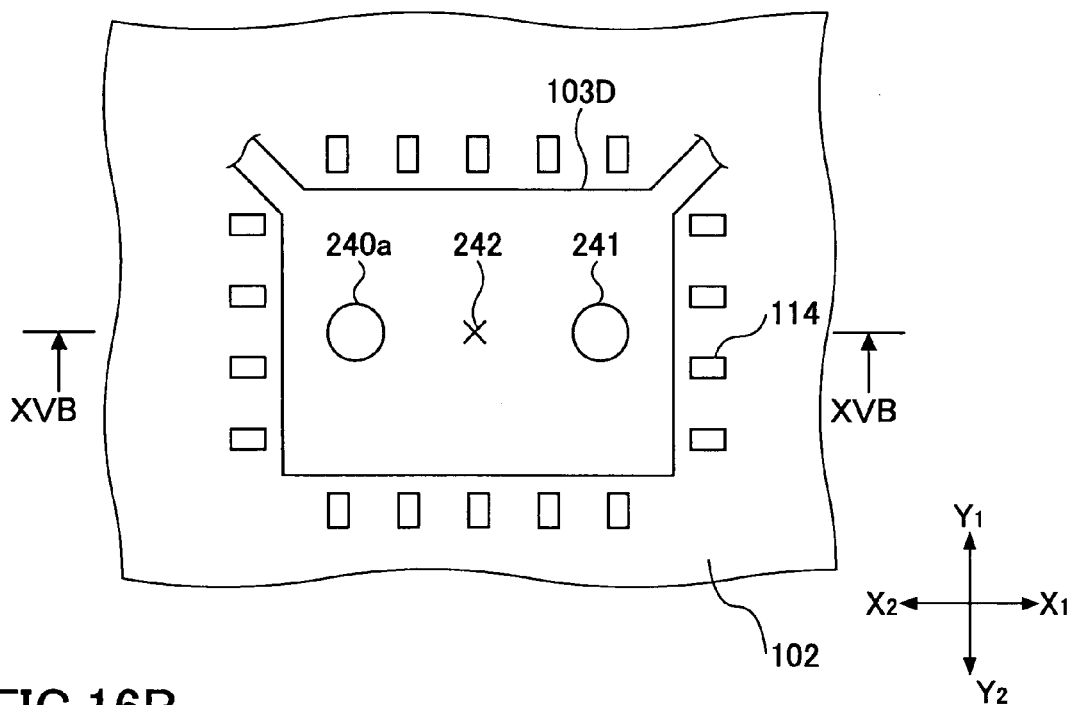
FIG. 16 is a view showing a die pad as a fifth modified example.
Figure 16B:
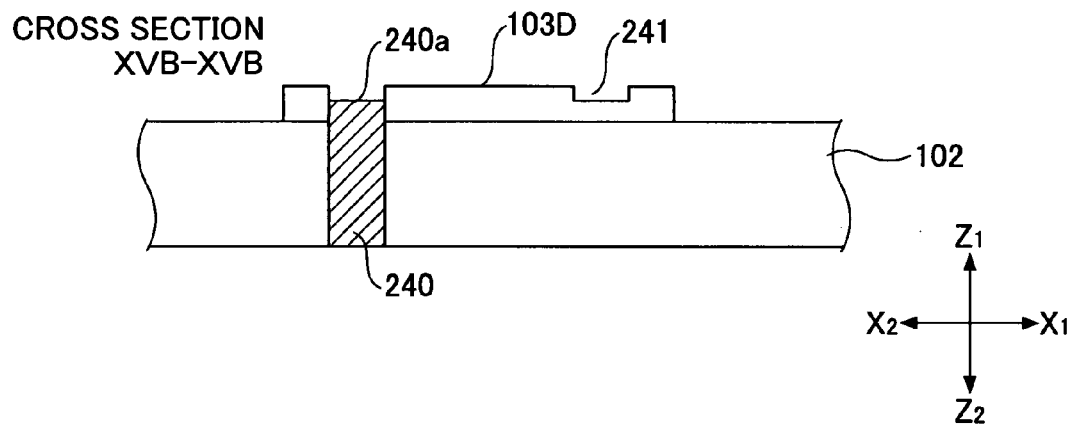
Figure 16C:
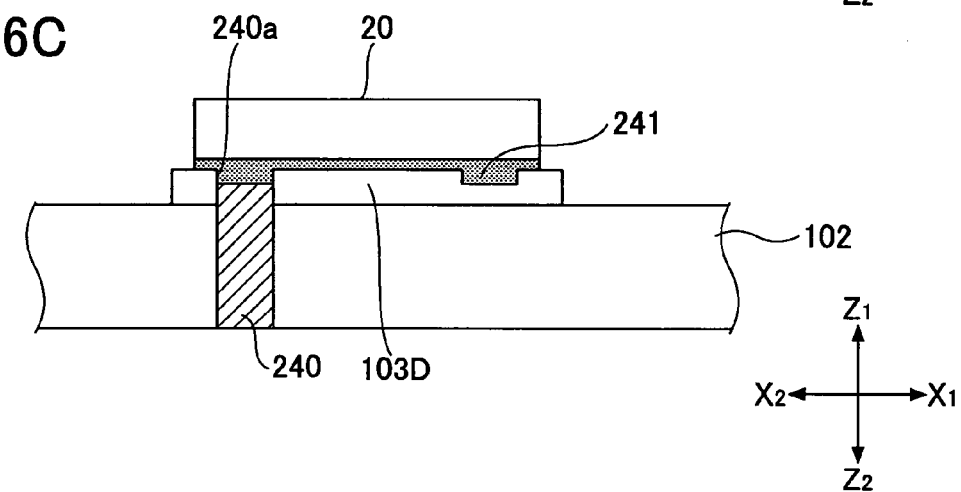

FIGS. 16A through 16C show a die pad 103D as a fifth modified example.

The die pad 103D includes a via 240. The upper surface of the via 240 defines a recess 240a, which is filled with Ag paste.

The die pad 103D includes a recess 241 such that the via 240 and the recess 241 are disposed in symmetrical positions with respect to a center point 242 of the die pad 103D. The recess 241 has the same shape as the recess 240a defined by the upper surface of the via 240, and is formed by etching.

Curing shrinkage of the Ag paste varies depending on the thickness of an Ag paste film. More specifically, the greater the thickness of the Ag paste film, the higher the shrinkage rate. Accordingly, if the recess 241 is not provided, as the Ag paste shrinks more on the area of the recess 240a than on the other areas, the semiconductor bare chip 20 might be tilted in the X2 direction.

According to the present invention, since the recess 241 is formed, the Ag paste film on the area of the recess 241 has the same thickness as the Ag paste film on the area of the recess 240a. Accordingly, similar to the Ag paste film on the area of the recess 240a, the Ag paste shrinks more on the area of the recess 241 than on the other area. Thus, the forces acting on the semiconductor bare chip 20 during curing are balanced, so that the semiconductor bare chip 20 maintains a horizontal attitude.

The die pad 103D may also have the grooves 110-1 through 110-8 shown in FIG. 7.

The present invention is also applicable if the die pad 103 and 103A-103E are formed on the surface of materials other than the board, such as, e.g., molded products. Further, the present invention is applicable if the Ag paste is applied without using the potting machine. For instance, the Ag paste may be manually applied by using, e.g., a syringe.

The present application is based on Japanese Priority Application No. 2006-345532 filed on Dec. 22, 2006, with the Japanese Patent Office, the entire contents of which are hereby incorporated by reference.

What is claimed is:

1. A mounting structure for a semiconductor element, comprising:
   a semiconductor element having a surface with an area;
   a die pad having a surface with a center, a peripheral edge and an area which is greater than the area of the semiconductor element to form a perimeter of the die pad extending beyond the semiconductor element,
   wherein the die pad includes a plurality of grooves formed radially in the surface thereof, each groove extending continuously from and including the center of the surface toward the peripheral edge and ending in the perimeter but spaced from the peripheral edge of the die pad,
   wherein each of the grooves has a shape of overlapping, substantial triangles each pointing toward the center of the die pad, and
   wherein the surface of the semiconductor element is bonded to the surface of the die pad through an adhesive film filling the grooves between the surface of the semiconductor element and the surface of the die pad and in the perimeter; and
   a wire extending between the semiconductor element and a terminal pad disposed around the die pad.

2. The structure as recited in claim 1, wherein the number of grooves is eight.

3. The structure as recited in claim 2, wherein the grooves are arranged in a longitudinal, a width and diagonal directions of the die pad.

4. A printed circuit board, comprising:
a board main body;
a die pad on the board main body; and
a semiconductor element having a surface with an area,
wherein the die pad has a surface with a center, a peripheral edge and an area which is greater than the area of the semiconductor element to form a perimeter of the die pad extending beyond the semiconductor element,
wherein the die pad includes a plurality of grooves formed radially in the surface thereof, each groove extending continuously from and including the center of the surface toward the peripheral edge and ending in the perimeter but spaced from the peripheral edge of the die pad,
wherein each of the grooves has a shape of overlapping, substantial triangles each pointing toward the center of the die pad, and
wherein the surface of the semiconductor element is bonded to the surface of the die pad through an adhesive film filling the grooves between the surface of the semiconductor element and the surface of the die pad and in the perimeter; and
a wire extending between the semiconductor element and a terminal pad disposed around the die pad.

5. The board as recited in claim 4, wherein the number of grooves is eight.

6. The board as recited in claim 5, wherein the grooves are arranged in a longitudinal, a width and diagonal directions of the die pad.

7. The structure as recited in claim 1, wherein each of the grooves is equally-spaced from adjacent grooves.

8. The board as recited in claim 4, wherein each of the grooves is equally-spaced from adjacent grooves.

* * * * *